United States Patent
Venkataramani (10) Patent No.: US 10,447,315 B2
(45) Date of Patent: Oct. 15, 2019

(54) CHANNEL ERROR RATE OPTIMIZATION USING MARKOV CODES

(71) Applicant: Seagate Technology LLC, Longmont, CO (US)

(72) Inventor: Raman Venkataramani, Longmont, CO (US)

(73) Assignee: Seagate Technologies LLC, Cupertino, CA (US)

( * ) Notice: Subject to any disclaimer, the term of this patent is extended or adjusted under 35 U.S.C. 154(b) by 116 days.

(21) Appl. No.: 15/677,304

(22) Filed: Aug. 15, 2017

(65) Prior Publication Data

US 2019/0058494 A1    Feb. 21, 2019

Related U.S. Application Data

(60) Provisional application No. 62/375,239, filed on Aug. 15, 2016.

(51) Int. Cl.
*H03M 13/41* (2006.01)
*H03M 13/00* (2006.01)
*H04L 1/00* (2006.01)

(52) U.S. Cl.
CPC ... *H03M 13/4146* (2013.01); *H03M 13/4138* (2013.01); *H03M 13/6337* (2013.01); *H04L 1/002* (2013.01); *H04L 1/0059* (2013.01)

(58) Field of Classification Search
None
See application file for complete search history.

(56) References Cited

U.S. PATENT DOCUMENTS

| | | | | |
|---|---|---|---|---|
| 5,806,029 A | * | 9/1998 | Buhrke | G10L 15/144 704/244 |
| 7,509,259 B2 | * | 3/2009 | Song | G06K 9/6277 704/243 |
| 8,207,874 B2 | | 6/2012 | Yang et al. | |
| 8,976,474 B1 | | 3/2015 | Wang et al. | |
| 2003/0026028 A1 | * | 2/2003 | Ichihara | G11B 20/10009 360/65 |
| 2007/0217522 A1 | | 9/2007 | Sun et al. | |
| 2011/0222584 A1 | | 9/2011 | Michaels | |
| 2011/0311003 A1 | | 12/2011 | Sun et al. | |
| 2014/0058731 A1 | * | 2/2014 | Tyagi | G10L 15/063 704/243 |
| 2014/0365201 A1 | * | 12/2014 | Gao | G06F 17/2818 704/2 |
| 2015/0323989 A1 | * | 11/2015 | Bateman | G06F 3/011 345/156 |

* cited by examiner

*Primary Examiner* — Justin R Knapp
(74) *Attorney, Agent, or Firm* — FisherBroyles LLP; Gregory T. Fettig (57) ABSTRACT

In one embodiment, a system provides for optimizing an error rate of data through a communication channel. The system includes a data generator operable to generate a training sequence as a Markov code, and to propagate the training sequence through the communication channel. The system also includes a Soft Output Viterbi Algorithm (SOVA) detector operable to estimate data values of the training sequence after propagation through the communication channel. The system also includes an optimizer operable to compare the estimated data values to the generated training sequence, to determine an error rate based on the comparison, and to change the training sequence based on the Markov code to lower the error rate of the data through the communication channel.

20 Claims, 8 Drawing Sheets

CHANNEL ERROR RATE OPTIMIZATION USING MARKOV CODES

CROSS REFERENCE TO RELATED APPLICATIONS

This patent application claims priority to, and thus the benefit of an earlier filing date from, U.S. Provisional Patent Application No. 62/375,239 (filed Aug. 15, 2016), the entire contents of which are hereby incorporated by reference.

SUMMARY

In one embodiment, a system provides for optimizing an error rate of data through a communication channel. The system includes a data generator operable to generate a training sequence as a Markov code, and to propagate the training sequence through the communication channel. The system also includes an equalizer/Soft Output Viterbi Algorithm (SOVA) detector operable to estimate data values of the training sequence after propagation through the communication channel. The system also includes an optimizer operable to compare the estimated data values to the generated training sequence, to determine an error rate based on the comparison, and to change the training sequence based on the Markov code to lower the error rate of the data through the communication channel.

The various embodiments disclosed herein may be implemented in a variety of ways as a matter of design choice. For example, some embodiments herein are implemented in hardware whereas other embodiments may include processes that are operable to implement and/or operate the hardware. Other exemplary embodiments, including software and firmware, are described below.

BRIEF DESCRIPTION OF THE FIGURES

Some embodiments are now described, by way of example only, and with reference to the accompanying drawings. The same reference number represents the same element or the same type of element on all drawings.

DETAILED DESCRIPTION

The figures and the following description illustrate specific exemplary embodiments. It will thus be appreciated that those skilled in the art will be able to devise various arrangements that, although not explicitly described or shown herein, embody certain principles and are included within the scope of this disclosure. Furthermore, any examples described herein are intended to aid in understanding the principles of the embodiments and are to be construed as being without limitation to such specifically recited examples and conditions. As a result, the embodiments are not limited to the examples described below.

The capacity of a communication channel was formalized by Claude Shannon in his 1948 treatise "A Mathematical Theory of Communication". In that treatise, Shannon provided a formula to compute channel capacity based on the maximization of mutual information between a channel input and the channel output over source probability distributions. The channel capacity imposes a fundamental bound on the maximum throughput performance of reliable communication with any error correcting code.

Computing the capacity of a communication channel is an interesting theoretical problem in its own right. One example includes the Blahut-Arimoto algorithm which has been devised to compute channel capacity of discrete memoryless channels as well as channels with memory, such as the magnetic recording channel of a disk drive. However, knowing the theoretical channel capacity does not immediately render how to achieve a maximum throughput with a practical error correcting code, which is a primary focus of coding theory. More recently, coding theorists have designed error correcting codes to closely approach the Shannon limit of channel capacity for certain channels.

Based on the notion of channel capacity, systems and methods presented herein are operable to optimize a channel input (i.e., a source) probability distribution function (PDF) to maximize the capacity of the channel. In this regard, a new source optimization is implemented based on a previously unused metric, such as the detection error rate (BER/SER). The problem employs a constraint on the minimum source rate $H(X) \geq h_0$ so as to prevent a trivial solution. However, $h_0$ can be viewed as free design parameter to allow for more design flexibility. Another advantage of using a metric such as the SER is that it uses a simpler detector (Viterbi or SOVA detector) as opposed to a soft output symbol detector, such as a BCJR detector (Bahl-Cocke-Jelinek-Raviv detector), which is used for the capacity metric.

With this in mind, systems and methods presented herein provide for the optimization of error rates in a channel, such as bit error rates (BERs) and symbol error rates (SERs). For example, solutions for channels, with or without memory, are provided herein along with the implementation of an iterative algorithm to optimize the error rate for the channel.

Figure 1:
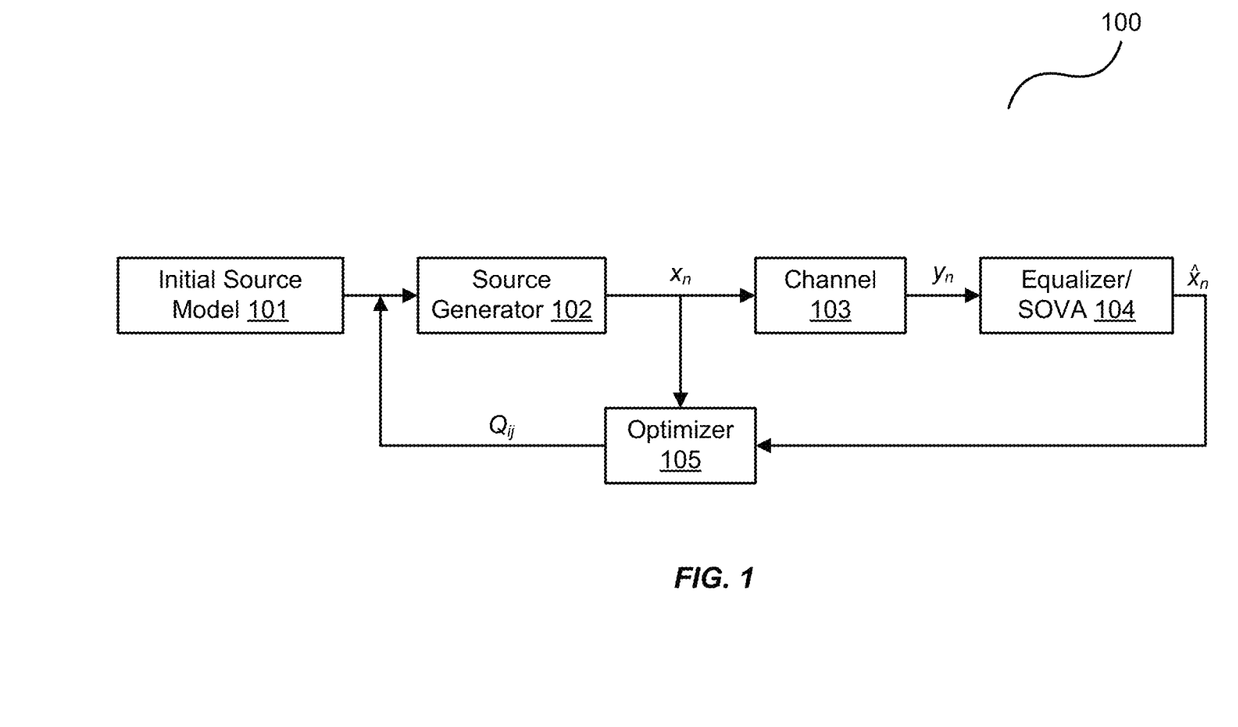
FIG. 1 is a block diagram of an exemplary system for optimizing an error rate of a channel.

FIG. 1 is a block diagram of an exemplary system 100 for optimizing an error rate of a channel 103. As mentioned, communication channels such as 103 have typically been evaluated based their capacities. That is, previous systems measured the maximum throughput of effective communication of data through the channel. Then, error correction codes could be implemented based on the channel capacity to ensure that the data transmitted through the channel could be recovered.

However, measuring the channel capacity does not always, in practice, accurately determine the amount of recoverable data that may pass through the channel. And, the channel's characteristics may change over time and/or even across its physical properties. For example, a hard disk drive (e.g., a channel with memory) may comprise a plurality of sectors where data is stored. Each sector of the hard disk drive may be thought of as unique channel because, among other reasons, each sector may comprise different physical properties from the next sector. Accordingly, each sector on the hard disk drive may vary in terms of capacity from one sector to the next.

The system 100 optimizes the data throughput of the channel 103 by optimizing the error rate of the channel 103 with a training sequence. Once the error rate of data through the channel 103 is optimized, actual data can be configured to mimic the data of the training sequence so as to reduce its error rate through the channel 103 and thereby effectively reduce the amount of error correction used to recover the data from the channel 103.

The system 100 starts the optimization by generating an initial source model 101 that is fed into a source generator 102. The source generator 102 generates the training sequence $x_n$ based on the initial source model 101 and propagates the training sequence $x_n$ through the channel 103. The channel 103, having an effect on the training sequence $x_n$ (i.e., the channel 103 introduces errors), results in a noisy observation sequence $y_n$ that is processed by an equalizer/SOVA detector 104.

The equalizer/SOVA detector 104 is a variant of the classical Viterbi algorithm. SOVA detectors have been used for years in the disk drive industry and can be implemented efficiently in a variety ways as a matter design choice. The equalizer/SOVA detector 104 differs from the classical Viterbi algorithm in that it uses a modified path metric which takes into account the a priori probabilities of input symbols, and produces a "soft output" indicating the reliability of the decision. And, the equalizer provides equalization of the signal prior to SOVA detection.

The equalizer/SOVA detector 104 processes the noisy training sequence $y_n$ to generate an estimated sequence $\hat{x}_n$. The optimizer 105 compares the sequence $\hat{x}_n$ to the original training sequence $x_n$ and outputs a new Markov source model $Q_{ij}$ to the source generator 102, while also tracking the error rate (e.g., BER and/or SER) through the channel 103 during each iteration. The quantity $Q_{ij}$, represents the probability of starting from the detector trellis states i and going to state j and fully describes the Markov source model. The source generator 102 then changes its output training sequence $x_n$ based on the new source model $Q_{ij}$ from the optimizer 105. When the lowest error rate has been obtained (e.g., after the last iteration), the channel 103 has been characterized and optimized in terms of its error rate such that data and error correction can be configured accordingly for propagation through the channel 103 and recovered therefrom.

More specifically, once the error rate of the channel 103 is optimized, subsequent data through the channel 103 can be similarly configured to have a comparable error rate. Thus, error correction codes can be tailored for that identified error rate instead of generically blanketing the data with error correction. This process may result in a lower data rate than previous systems. However, as less error correction may be used, the actual data throughput across the channel 103 may increase, in some instances significantly.

Figure 2:
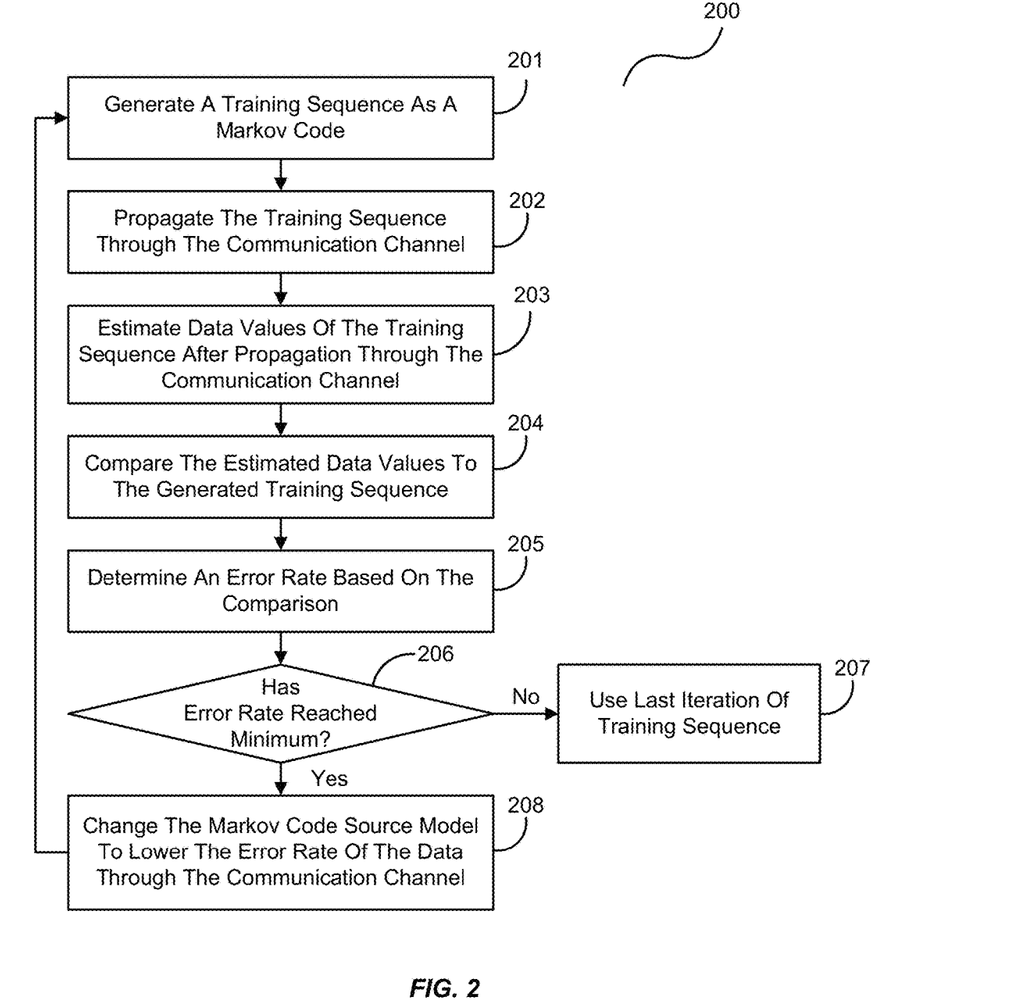
FIG. 2 is a flowchart illustrating an exemplary process operable with the system of FIG. 1.

FIG. 2 is a flowchart illustrating an exemplary process 200 operable with the system 100 of FIG. 1. In this embodiment, the source generator 102 generates a training sequence as a Markov code, in the process element 201. For example, the source generator 102 may initially receive an input from the initial source model 101 that prompts the source generator 102 to output a training sequence. In this regard, the source generator 102, acting on this initial source model 101, produces a random process that undergoes transitions from one state to another on a state space. The probability distribution of a next state depends on the current state and not on the sequence of events that preceded it. This specific kind of finite memory property produces a Markov chain of states, or equivalently the training sequence $x_n$, that is then propagated through the communication channel 103, in the process element 202.

In the process element 203, the equalizer/SOVA detector 104 estimates data values of the input training sequence after the propagation through the communication channel 103. The optimizer 105 then compares the estimated data values to the generated training sequence from the source generator 102, in the process element 204, to determine an error rate of the data propagating through the channel 103, in the process element 205. That is, the optimizer 105 compares the original training sequence $x_n$ to the estimated values of the training sequence $\hat{x}_n$. The optimizer 105 then determines the error rate based on the comparison. The optimizer 105 compares that error rate with the previous iteration to determine if it has settled to a minimum, in the process element 206.

If the error rate is lower, the optimizer 105 outputs the model $Q_{ij}$ that operates as a new input model to the source generator 102. In this regard, the optimizer 105 directs the source generator 102 to change the training sequence $x_n$ via the change in the Markov source model in an attempt to lower the error rate of the data through the communication channel 103, in the process element 208. And, the process 200 returns to the process element 201 to thus generate the new training sequence for the channel 103. If, however, the error rate has settled to a minimum (e.g., nearly the same as the previous error rate), in the process element 206, the optimizer 105 may use the last iteration of the training sequence, in the process element 207, as a basis for characterizing the channel 103 in terms of its error rate. In this regard, the optimizer 105 may also use this model of the Markov chain to configure subsequent actual data through the channel 103 as well as error correction with that data.

The embodiments shown and described herein may be implemented for memoryless channels and/or channels with memory. In some embodiments, the system 100 may be implemented as firmware within a disk drive system (i.e., channel with memory) to characterize the disk drive, and/or various sectors and regions thereof, in terms of its bit error rate. Then, coding techniques can be applied based on that bit error rate, including precoding and error correction coding, that configure how the data is to be written to and recovered from the disk drive. Other exemplary embodiments are shown and described in greater detail below.

Source Optimization Based on SER Metric

In this embodiment, Markov code source optimization is based on an error rate metric of the channel 103. More specifically, the system 100 is operable to find a Markov source model that minimizes the detected symbol error rate $P_e$ with a lower limit constraint on the source rate (e.g., entropy) H(X). For example, the system 100 is operable to:

$$\min_{P(X)} P_e \text{ such that } H(X) \geq h_o, \quad \text{Eq. 1.}$$

where $h_0$ is a minimum allowed source rate. A constraint on the source rate H(X), in this embodiment, is used because it would obtain a trivial solution of $P_e=0$ when H(X)=0 without it. Accordingly, a solution is sought in the space of Markov source models $Q_{ij}=\mu_i P_{ij}$, where $P_{ij}$ is the Markov transition probability from trellis state i to state j, and $\mu_i$ is the steady state probability of trellis state i. In this regard, a first solution for memoryless channels is presented as it is generally an easier problem than the case of channels with memory.

Memoryless Channel

Consider the source optimization problem for a discrete memoryless channel having an input alphabet $\mathcal{X}$ and an output alphabet $\mathcal{Y}$. The expression for the detected SER is the expected value (e.g., over $\mathcal{X}$) of the given that a particular symbol x from $\mathcal{X}$ was transmitted. In other words, $$P_e = \sum_{x \in X} P(x)E(x), \qquad \text{Eq. 2.}$$

where $E(x)=P(\hat{x}\neq x|x$ transmitted) and denotes the conditional SER given that the symbol x is transmitted and detected as $\hat{x}\neq x$. One example includes the maximum a posteriori (MAP) detector that is optimal in terms of the SER metric. It produces an output $\hat{x}$ that maximizes the probability $P(x|y) \propto P(x)P(y|x)$ over all $x \in \mathcal{X}$ as follows:

$$\hat{x} = \underset{x}{\operatorname{argmax}} P(x)P(y|x). \qquad \text{Eq. 3.}$$

Figure 3:
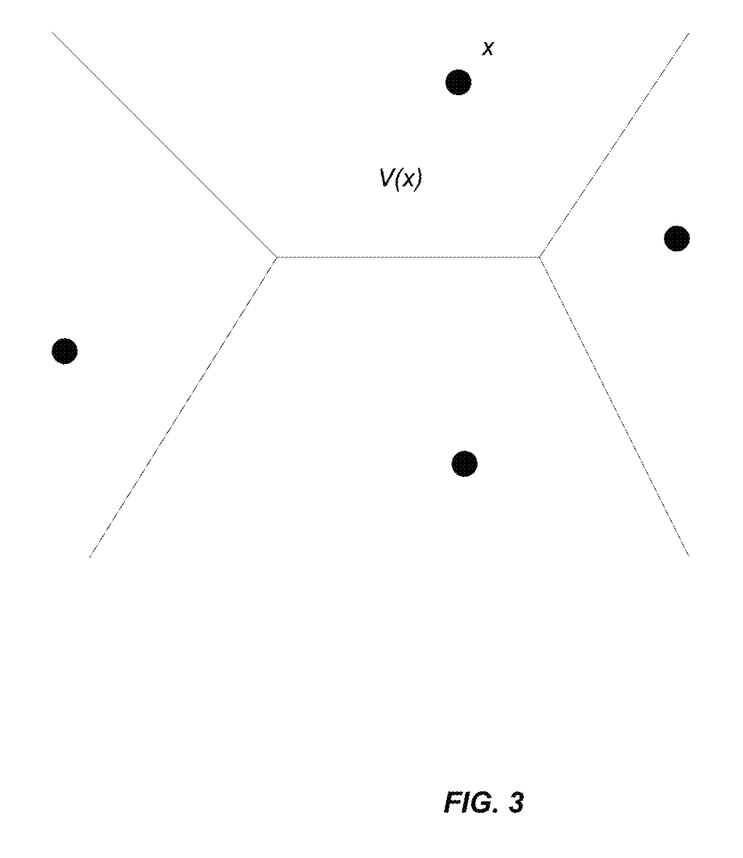
FIG. 3 is an exemplary Voronoi plot illustrating the decision regions for the optimization of an error rate for a memoryless channel.

Based on the probability density function $P(x|y)$, the output alphabet $\mathcal{Y}$ is partitioned into decision regions $\mathcal{V}(x)$ (e.g., "Voronoi cells") for each input symbol x as shown in FIG. 3. Detection is achieved by determining the cell in which the received signal y lies, resulting in $E(x)=P(y \notin \mathcal{V}(x))$ where $E(x)$ is computed either analytically (e.g., for relatively simple channels) or numerically. Summarizing, the source optimization problem can be stated as:

$$\min_{P(x)} \sum_x P(x)E(x), \qquad \text{Eq. 4.}$$

such that $$H(X) \stackrel{\text{def}}{=} -\Sigma_x P(x) \log_2 P(x) \geq h_0. \qquad \text{Eq. 5.}$$

Assuming that the "E-factors" $E(x)$ are fixed quantities, an optimizing $P(X)$ can be found by solving the following set of nonlinear equations:

$$P(x) = Z^{-1} 2^{-E(x)/\lambda}, \qquad \text{Eq. 6.}$$

$$Z = \Sigma_x 2^{-E(x)/\lambda}, \qquad \text{Eq. 7.}$$

and $$h_0 = -\Sigma_x P(x) \log_2 P(x), \qquad \text{Eq. 8.}$$

where the auxiliary parameter $\lambda > 0$ is the Lagrange multiplier associated with the entropy constraint.

However, $E(x)$ does not generally remain constant since they depend implicitly on $P(X)$, and altering it will cause $E(x)$ to change too. Accordingly, the system 100 employs an iterative algorithm where, in each iteration, the E-factors are computed based on the current source model from the source generator 102. The source generator 102 is then updated treating the E-factors as constant. Such is summarized in the algorithm below:

First, initialize source $P(X)$ (e.g., an initial input 101 of independent, identically distributed "IID" random variables).
Then, repeat the following steps until convergence
Estimate E-factors $E(x)$ for current source $P(X)$; and
Treating $E(x)$ as fixed, update $P(X)$ to minimize $P_e$.

Channels with Memory

For the general case of Markov source optimization for channels with memory and for a given Markov source model $Q_{ij}=\mu_i P_{ij}$, the SER can be linearly approximated in a manner similar to Equation 3 as:

$$P_e = \Sigma_{i,j} Q_{ij} E_{ij}, \qquad \text{Eq. 9.}$$

for suitable coefficients $E_{ij}$. The estimation of these coefficients is implemented via training. Therefore, the source optimization problem of Equation 1 becomes $$\min_{Q_{ij}} \sum_{i,j} Q_{ij} E_{ij} \qquad \text{Eq. 10}$$

such that $$H(X) \stackrel{\text{def}}{=} -\Sigma_{i,j} Q_{ij} \log_2 P_{ij} \geq h_0. \qquad \text{Eq. 11.}$$

Again, assuming that the E-factors $E_{ij}$ are fixed quantities, it can be shown that the optimal Markov source model can be obtained. For example, let $\lambda > 0$ denote the as yet unknown Lagrange multiplier associated with the entropy constraint. Then, construct a "noisy" adjacency matrix $A_{ij}=2^{-E_{ij}/\lambda}$, and compute the optimal Markov model as follows:

$$\mu_i = \frac{u_i v_i}{\sum_i u_i v_i}, \; P_{ij} = \frac{v_j}{v_i} \frac{A_{ij}}{\lambda_{max}} \text{ and } C = \log_2 \lambda_{max}, \qquad \text{Eq. 12.}$$

where u and v are respectively the left and right eigenvectors of A corresponding to its largest eigenvalue $\lambda_{max}$. Afterwards, $\lambda$ is chosen to satisfy the source entropy constraint as follows:

$$h_0 = -\Sigma_{i,j} \mu_i P_{ij} \log_2 P_{ij}. \qquad \text{Eq. 13.}$$

This is a boundary solution in the sense that the source rate inequality constraint is in fact satisfied with an equality. The solution is found using a standard nonlinear equation solver.

Estimation of the E-factors $E_{ij}$ can be obtained through training. Generally, in practice, the E-factors $E_{ij}$ are difficult to compute analytically. A stochastic estimate for $E_{ij}$ using training data is presented. In this regard, let the sequence $x_1^N$ of length N denote the input to the channel 103 and the sequence $\hat{x}_1^N$ denote the output of the equalizer/SOVA detector 104 (i.e., the detected training sequences). Also, let $\varepsilon_n = \Pi(x_n \neq \hat{x}_n)$ denote the error indicator sequence, and $w_H(\bullet)$ be the Hamming weight function. Thus, as described in greater detail in the below:

$$E_{ij} = E_{ij}^a - E_i^b, \qquad \text{Eq. 14.}$$

where $$E_{ij}^a = \frac{1}{NQ_{ij}} \sum_n w_H(\varepsilon_{n-J}^{n+J-M}) \mathbb{1}(S_{n-1}^n = (i,j)) \qquad \text{Eq. 15}$$

$$E_i^b = \frac{1}{N\mu_i} \sum_n w_H(\varepsilon_{n-J+1}^{n+J-M}) \mathbb{1}(s_n = i), \qquad \text{Eq. 16.}$$

for a window size parameter J that is typically chosen as a small integer.

In the summation of Eq. 15, all time indices n are observed where state $s_{n-1}=i$ to the state $s_n=j$. For those indices, the number of errors found in the subsequence $\{\varepsilon_{n-J}, \ldots, \varepsilon_{n-J+M}\}$ are accumulated and a local neighborhood of time index n is identified. Likewise with Eq. 16, the number of errors found in $\{\varepsilon_{n-J+1}, \ldots, \varepsilon_{n-J+M}\}$ are accumulated as the system 100 passes through state $s_n$=i at time n. Both expressions are relatively straightforward computations involving pattern matching and accumulation of error weights. This algorithm can be summarized as follows.

First, initialize Markov source $Q_{ij}$ (e.g., an initial input 101 of IID random variables).

Then repeat the following steps until convergence:
  Generate training sequence $x_1^N$ from source $Q_{ij}$;
  Pass $x_1^N$ through channel and detector to get $\hat{x}_1^N$;
  Estimate E-factors $E_{ij}=E_{ij}^a-E_i^b$ using Eqs. 15 and 16; and
  Solve optimization problem of Eq. 10 to obtain a new $Q_{ij}$.

Figure 4:
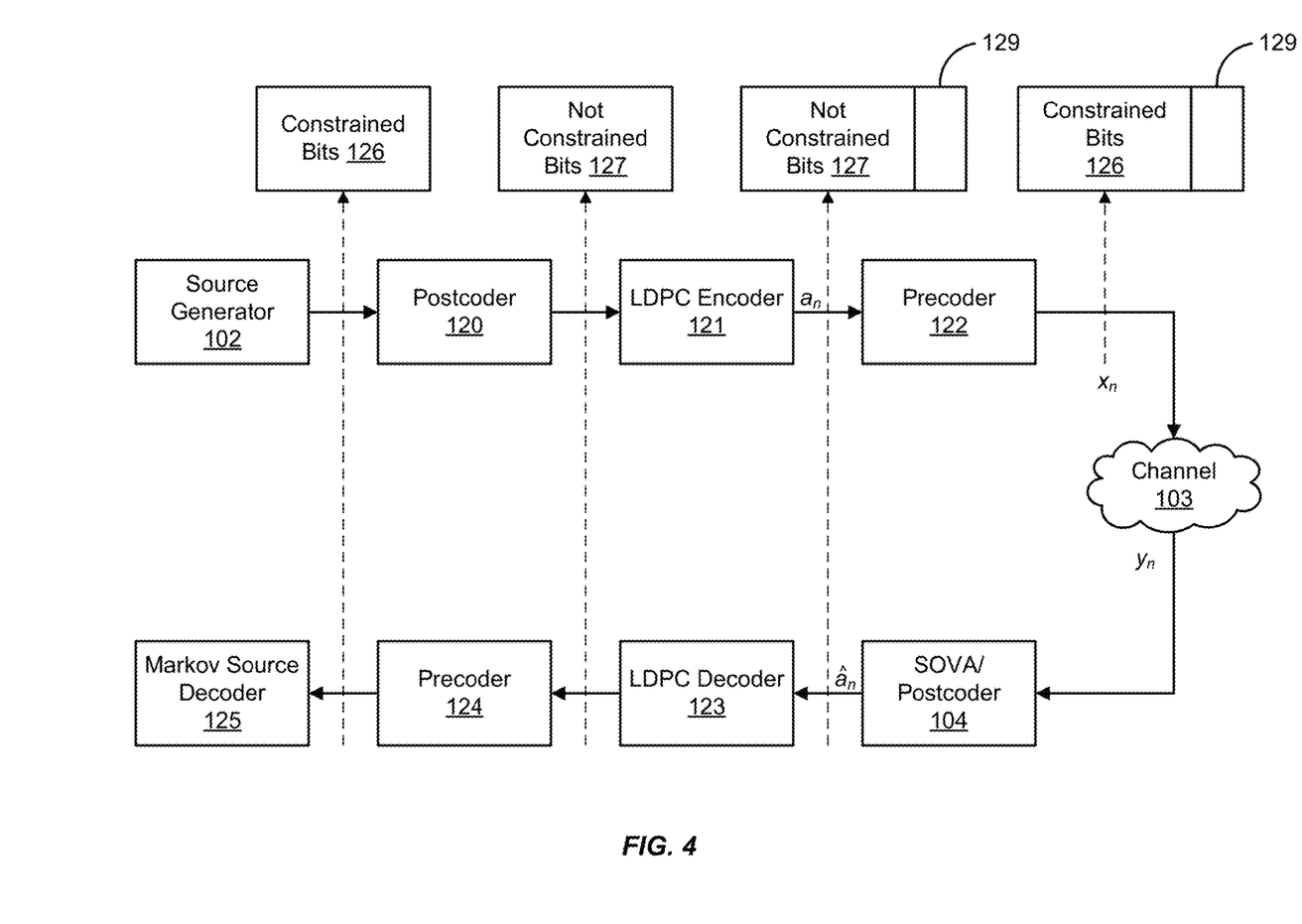
FIG. 4 is a block diagram of an exemplary data flow of the system of FIG. 1.

FIG. 4 is a block diagram exemplarily summarizing functional aspects of the system 100 of FIG. 1. The source generator 102 generates the training sequence $x_1^N$ based on the Markov model probabilities $Q_{ij}=\mu_i P_{ij}$. The source generator 102 can be implemented with a specially designed Markov source encoder, such as an arithmetic encoder, or an idealized finite state machine which traverses the states of the trellis based on the given transition probabilities $P_{ij}$, forming constrained bits 126. A pseudo random number generator can be used to drive such source generators.

Postcoding (e.g., postcoder 120) results in bits that are not constrained. These bits are then transferred to a Low Density Parity Check (LDPC) encoder 121 to add parity 129 for error correction. The precoder 122 provides returns the bits to their constrained form with parity bits 129. Precoding by the precoder 122 can be used to improve performance. The BER in the postcoded domain 127 (e.g., using bits $a_n$ and $\hat{a}_n$) is minimized while maintaining the Markov property in the precoded domain bits $x_n$ (e.g., on the media), excluding the parity bits 129 added by the LDPC encoder 121.

The equalizer/SOVA detector 104 and the channel 103 generally constitute an environment from the point where the bits are transmitted or written onto media, such as a storage device (e.g., disk drive or solid state drive—"SSD"), to the point where they are received and detected. The LDPC decoder 123 and the precoder 124 return the sequence to its form after the effects of the LDPC encoder 121 and the postcoder 120. The only change to the algorithm is that the system 100 computes the error vector based on the postcoded bits, i.e., $\varepsilon_n=\Pi(a_n \neq \hat{a}_n)$, again excluding the parity bits 129. The Markov source decoder 125 then extracts the Markov code to reveal underlying data.

The optimizer 105 computes the E-factors $E_{ij}$ from the error vector $\varepsilon_n$ and computes new source probabilities $Q_{ij}$ by solving Equation 10. This generally involves finding the largest eigenvalue of a matrix and solving nonlinear equations. Hence, the calculations may be more suitable for implementation in firmware or as an offline calibration, but specialized hardware implementation is also possible. The free parameter $h_0$ controls the source rate and yields an extra degree of design flexibility.

The source generator 105 can be initialized with an IID model (e.g., with all states being equally probable). Alternatively, in a magnetic recording system, different disc drives or even different zones on a given disc may have different optimal Markov sources, owing to their different signal/noise statistics. These different Markov models may, however, be similar enough that the source generator 102 could start with a relatively good/common initial solution such that the optimizer 105 can "fine tune" the initial code separately for each drive or zone within a relatively small number of iterations.

The system 100 can be used with any alternative cost function (instead of the SER) when it is expressed in a linear form similar to Equation 5. For example, the system 100 can minimize the conditional entropy H(X|Y) of input X given the output Y. This cost function represents the uncertainty in X given Y. To implement such, the system 100 sets $E_{ij}=-T_{ij}$, where $T_{ij}$ are the T-factors of a generalized Blahut-Arimoto algorithm defined as:

$$T_{ij}=\Sigma_y P(y|s_{n-1}{}^n=(i,j))\log_2 P(s_{n-1}{}^n=(i,j)|y)-\Sigma_y P(y|s_n=i) \log_2 P(s_n=i|y) \quad \text{Eq. 17.}$$

This approach maximizes the channel capacity but with the source rate being specified explicitly as: $H(X)=h_0$.

The following is an example Markov source designed for magnetic recording channels, specifically for a drive having a channel bit density (CBD) of 2.8. Here, the goal was to optimize the Markov code having the same source rate as a maximum transition run (MTR) constraint code of K=3, but with a better BER performance. The MTR code, which is commonly used in magnetic recording, limits the number of consecutive transition in the source sequence to K=3 and has a source rate of $H_{MTR3}=0.94678$ bits. The motivation for such a design is that it would be a drop-in replacement for the MTR-3 code, due to its identical source rate, without requiring changes to other system parameters such as the CBD and LDPC code rates.

Figure 5:
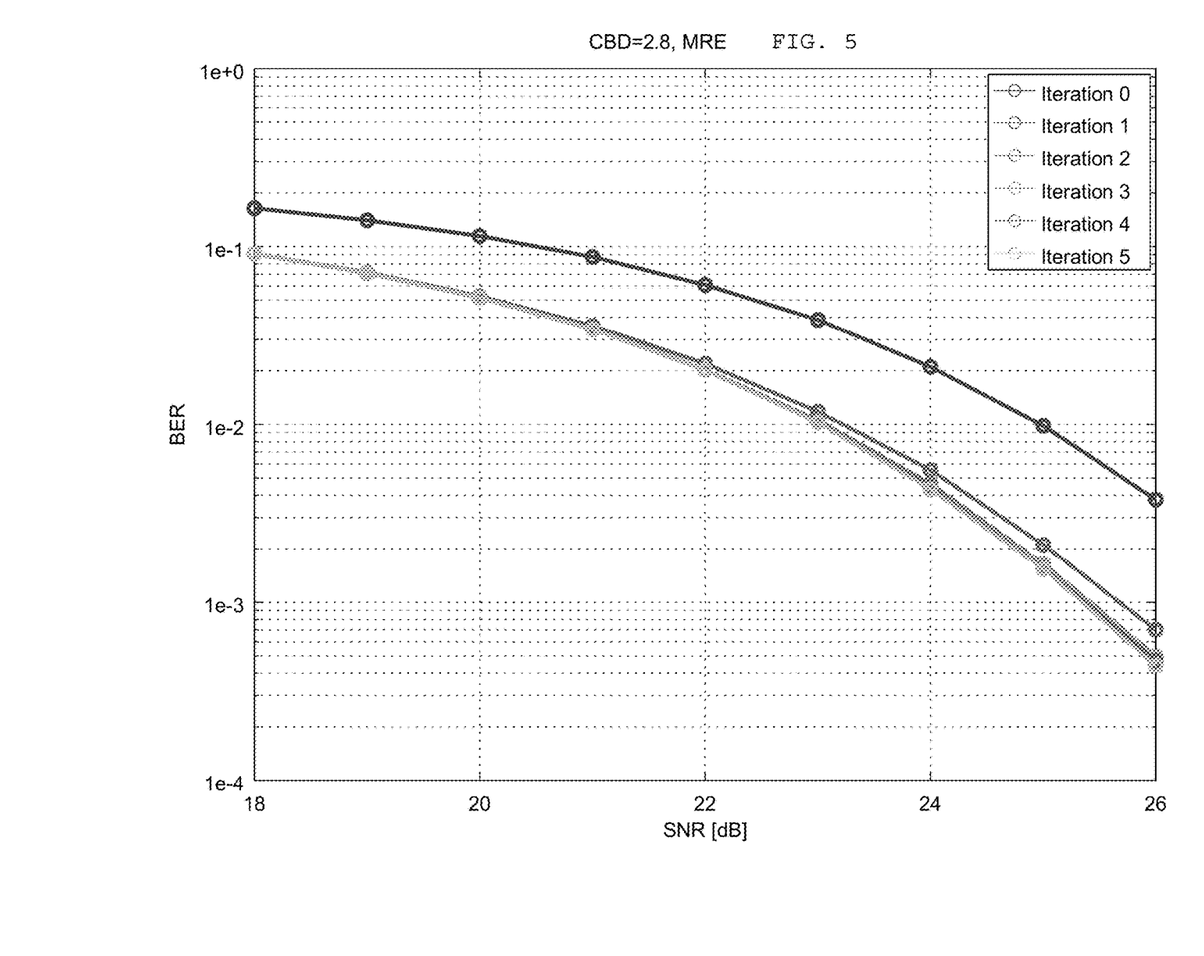
FIGS. 5-7 are graphs illustrating exemplary simulation results of the system of FIG. 1.

The BER minimizing source optimizer was implemented with the setting of $h_0=H_{MTR3}=0.94678$ starting from an IID source model. FIG. 5 shows the BER vs. the signal to noise ratio (SNR) for the initial IID source (labeled as "iteration 0") and after each iteration thereafter. There is a relatively large jump from iteration "0" to iteration "1" because the source entropy H(X) changes from "1" (for the IID source) to $h_0$. In the subsequent iterations, $H(X)=h_0$ (i.e., it remains constant) and the BER drops only slightly with near convergence after two iterations.

Figure 6:
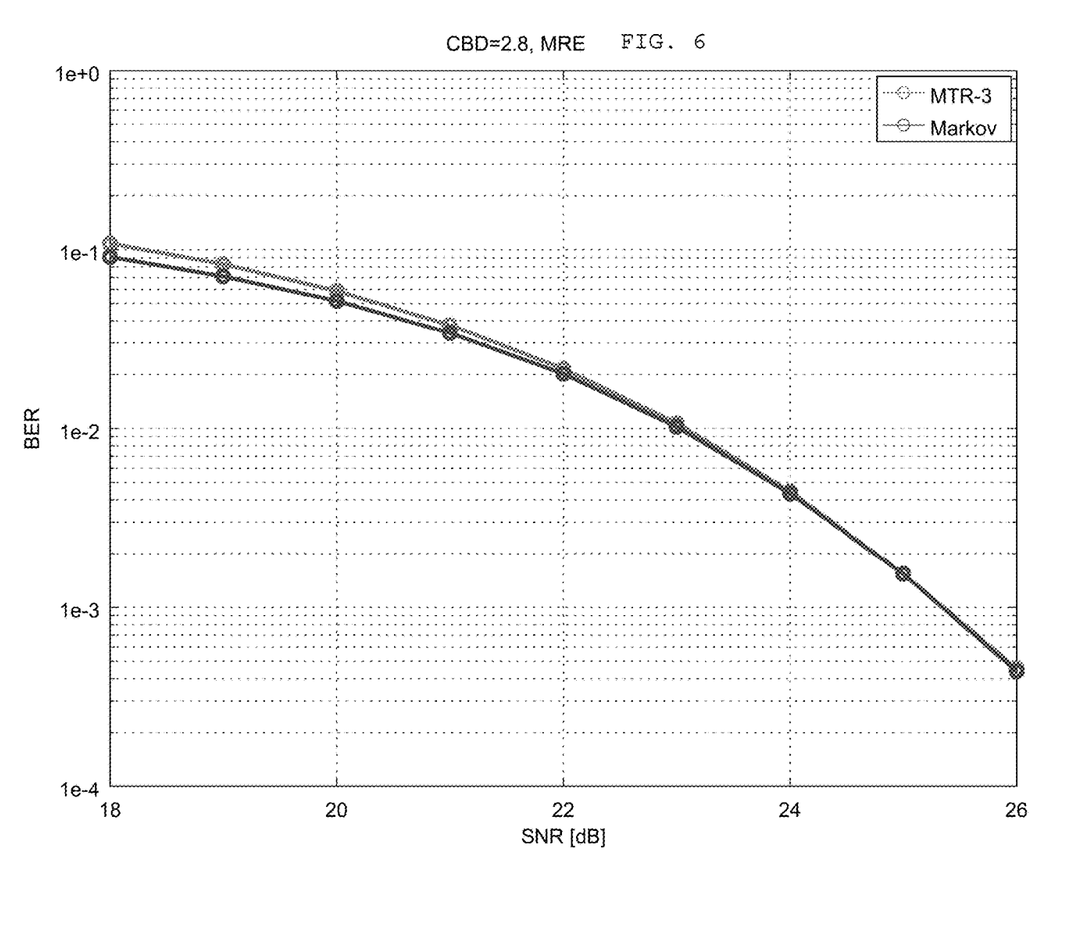
Figure 7:
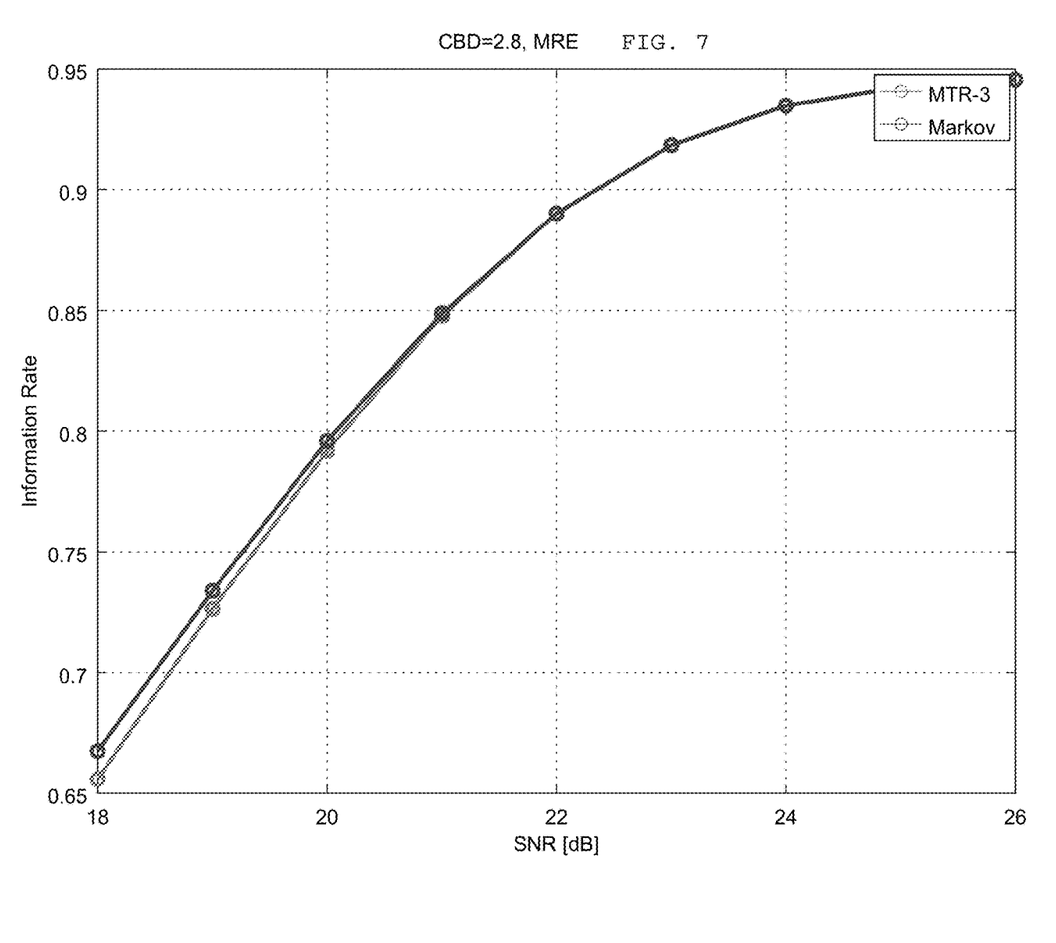

FIG. 6 compares the BER for the Markov source (after convergence of the algorithm) and the BER for the MTR-3 source. FIG. 7 shows a similar comparison of the information rates for the new Markov source and the MTR-3 source. Both of the plots of FIGS. 6 and 7 show that the Markov source offers a considerable gain over MTR-3, especially at lower SNR values.

Expression for $P_e$

One goal is to show that the probability of detection error $P_e$ can be expressed approximately as Eq. 9 to derive explicit formulas for $Et_{ij}$. For example, let $x_1^N$ and $\hat{x}_1^N$ denote the channel input and SOVA detected output training sequences. It can then be assumed that the probability of $x_n$ being detected incorrectly depends strongly only on a "local neighborhood" consisting of a (2J+1) symbol subsequence $\Pi_n=x_{n-J}^{n+J}$ for a suitable window size parameter J as follows:

$$P(\hat{x}_1^N \neq x_n | x_1^N) \approx P(\hat{x}_1^N \neq x_n | \Pi_n) \stackrel{\text{def}}{=} E(\Pi_n). \quad \text{Eq. 18.}$$

This approximation is used to limit the computational complexity of the algorithm. By ergodicity, a statistical estimate for $E(\Pi)$ for each symbol pattern $\Pi$ of length 2J+1 is:

$$E(\Pi) = \frac{1}{NP(\Pi)} \sum_{n:\Pi_n=\Pi} \mathbb{1}(\hat{x}_n \neq x_n), \quad \text{Eq. 19.}$$

where $\Pi(\bullet)$ is the indicator function. Then, the SER expression is:

$$P_e = \Sigma_\Pi P(\Pi) E(\Pi).$$  Eq. 20.

Note that the symbol subsequence $\Pi = \pi_0^{2J}$ is equivalent to a subsequence $\alpha_0^{2J-M+1}$ of an M-bit detector trellis states $\alpha_k \stackrel{\text{def}}{=} \pi_k^{k+M-1}$. Therefore, the Markov source model $Q_{ij} = \mu_i P_{ij}$ for the source generator 102 implies that:

$$P(\Pi) = P(\alpha_0^{2J-M+1}) = \Pi_{k+0}^{2J-M} Q_{\alpha_k,\alpha_{k+1}} \Pi_{k=1}^{2J-M} \mu_{\alpha_k}^{-1},$$  Eq. 21.

Since the probability $P(\Pi)$, and hence $P_e$, are both non-linear functions of the Markov probabilities, an approximate expression for $P_e$ can be derived by linearizing near a given source $Q_{ij} = \mu_i P_{ij}$. In this regard, the derivative of log $P(\Pi)$ at the current model $Q_{ij} = \mu_i P_{ij}$ can be computed as:

$$\delta \log P(\Pi) \approx \Sigma_{k=0}^{2J-M} \delta \log Q_{\alpha_k,\alpha_{k+1}} - \Sigma_{k=1}^{2J-M} \delta \log \mu_{\alpha_k}.$$  Eq. 22.

Therefore, $$\delta P(\Pi) = P(\Pi) \left( \sum_{k=0}^{2J-M} \frac{\delta Q_{\alpha_k,\alpha_{k+1}}}{Q_{\alpha_k,\alpha_{k+1}}} - \sum_{k=1}^{2J-M} \frac{\delta \mu_{\alpha_k}}{\mu_{\alpha_k}} \right).$$  Eq. 23.

So, $P_e$ can be approximated at the current model $Q_{ij} = \mu_i P_{ij}$ as follows:

$$\delta P_e = \sum_{\Pi}^{\Pi} E(\Pi) \delta P(\Pi) =$$  Eq. 24.

$$\sum_{\Pi} E(\Pi) P(\Pi) \left( \sum_{k=0}^{2J-M} \frac{\delta Q_{\alpha_k,\alpha_{k+1}}}{Q_{\alpha_k,\alpha_{k+1}}} - \sum_{k=1}^{2J-M} \frac{\delta \mu_{\alpha_k}}{\mu_{\alpha_k}} \right) \equiv$$

$$\sum_{ij} E_{ij}^a \delta Q_{ij} - \sum_i E_i^b \delta \mu_i.$$

This yields the desired form for $P_e$ as follows:

$$P_e \approx \Sigma_{ij} E_{ij}^a Q_{ij} - \Sigma_i E_i^b \mu_i = \Sigma_{ij} E_{ij} Q_{ij},$$  Eq. 25.

where $E_{ij} = E_{ij}^a - E_i^b$. With $U(\Pi) \stackrel{\text{def}}{=} E(\Pi) P(\Pi)$, it can be readily seen that $$E_{ij}^a =$$  Eq. 26.

$$\sum_{\Pi} U(\Pi) \sum_{k=0}^{2J-M} \frac{\mathbb{1}(\alpha_k = i, \alpha_{k+1} = j)}{Q_{\alpha_k,\alpha_{k+1}}} = \sum_{k=0}^{2J-M} \sum_{\Pi:\alpha_k^{k+1}=(i,j)} \frac{U(\Pi)}{Q_{ij}},$$

and $$E_i^b = \sum_{k=1}^{2J-M} \sum_{\Pi:\alpha_k = i} \frac{U(\Pi)}{\mu_i}.$$  Eq. 27.

To illustrate, consider a binary-input channel with a trellis memory of M=4 and a window size parameter of J=3. Then, $\Pi$ is a 7-bit pattern consisting of 4 adjacent trellis states, $\Pi = (\alpha, \beta, \gamma, \delta)$. This means that the following expression for $P(\Pi)$ is:

$$P(\Pi) = P(\alpha \beta \gamma \delta) = \mu_\alpha P_{\alpha \beta} P_{\beta \gamma} P_{\gamma \delta} \equiv \frac{Q_{\alpha \beta} Q_{\beta \gamma} Q_{\gamma \delta}}{\mu_\beta \mu_\gamma}.$$  Eq. 28.

Assuming that $E(\Pi) = E(\alpha \beta \gamma \delta)$ has been estimated, Equations 26 and 27 may be computed as Equations 29 and 30 as follows:

$$E_{ij}^a = \frac{1}{Q_{ij}} \left( \sum_{\gamma \delta} U(ij\gamma\delta) + \sum_{\alpha \delta} U(\alpha ij\delta) + \sum_{\alpha \beta} U(\alpha \beta ij) \right)$$  Eq. 29.

$$\equiv \frac{1}{Q_{ij}} \left( \sum_{\alpha \beta} [U(ij\alpha\beta) + U(\alpha ij\beta) + U(\alpha \beta ij)] \right), \text{ and}$$

$$E_i^b = \frac{1}{\mu_i} \left( \sum_{\alpha \gamma \delta} U(\alpha i \gamma \delta) + \sum_{\alpha \beta \delta} U(\alpha \beta i \delta) \right)$$  Eq. 30.

$$\equiv \frac{1}{\mu_i} \left( \sum_{\alpha \beta \gamma} [U(\alpha i \beta \gamma) + U(\alpha \beta i \gamma)] \right),$$

where $U(\alpha \beta \gamma \delta) = E(\alpha \beta \gamma \delta) P(\alpha \beta \gamma \delta)$.

Training Based Estimation of $E_{ij}$

In this section, it is illustrated how $E(\Pi)$ and $E_{ij}$ can be estimated from training data. For example, let $\varepsilon_n = \mathbb{1}(x_n \neq \hat{x}_1^N)$ denote the bit error sequence and let $w_H(\bullet)$ denote the Hamming weight. A stochastic (e.g., training based) estimate of $E(\Pi)$ is then given by $$E(\Pi) = \frac{1}{NP(\Pi)} \sum_{n:\Pi_n = \Pi} \mathbb{1}(\hat{x}_1^N \neq x_n).$$  Eq. 31.

Inserting Equation 31 into Equation 26 yields $$E_{ij}^a = \sum_{k=0}^{2J-M} \sum_{\Pi:\alpha_k^{k+1}=(i,j)} \frac{E(\Pi) P(\Pi)}{Q_{ij}} =$$  Eq. 32.

$$\frac{1}{NQ_{ij}} \sum_{k=0}^{2J-M} \sum_{\Pi} \sum_{n:\Pi_n=\Pi} \mathbb{1}(\hat{x}_n \neq x_n, \alpha_k^{k+1} = (i,j)) =$$

$$\frac{1}{NQ_{ij}} \sum_{k=0}^{2J-M} \sum_n \mathbb{1}(\hat{x}_n \neq x_n, s_{k+n-J+M-1}^{k+n-J+M} = (i,j)) =$$

$$\frac{1}{NQ_{ij}} \sum_{k=0}^{2J-M} \sum_n \mathbb{1}(\varepsilon_{n+J-M-k}) \mathbb{1}(s_{n-1}^n = (i,j)),$$

which can be rewritten as $$E_{ij}^a = \frac{1}{NQ_{ij}} \sum_n w_H(\varepsilon_{n-J}^{n+J-M}) \mathbb{1}(s_{n-1}^n = (i,j)).$$  Eq. 33.

Similarly, inserting Equation 31 into Equation 27 and proceeding as before:

$$E_i^b = \frac{1}{N\mu_i} \sum_n w_H(\varepsilon_{n-J+1}^{n+J-M}) \mathbb{1}(s_n = i).$$  Eq. 34.

And then, the E-factors can be estimated using $E_{ij} = E_{ij}^a - E_i^b$.

Figure 8:
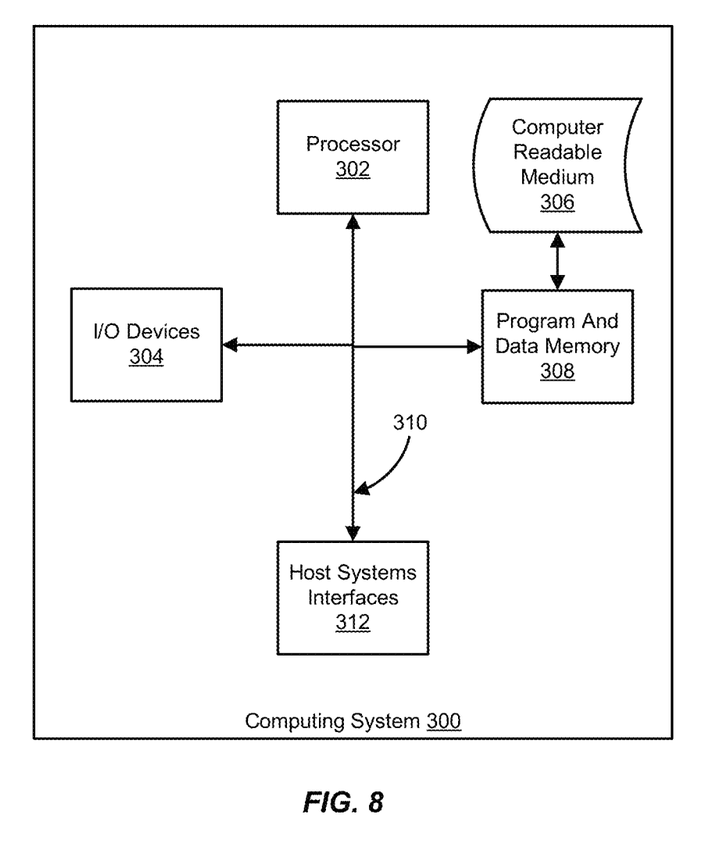
FIG. 8 is a block diagram of an exemplary computing system in which a computer readable medium provides instructions for performing methods herein.

The embodiments can take the form of an entirely hardware embodiment, an entirely software embodiment or an embodiment containing both hardware and software elements. One embodiment disclosed herein is implemented in software, which includes but is not limited to firmware, resident software, microcode, etc. FIG. 8 illustrates a computing system 300 in which a computer readable medium 306 may provide instructions for performing any of the methods disclosed herein.

Furthermore, the embodiments can take the form of a computer program product accessible from the computer readable medium 306 providing program code for use by or in connection with a computer or any instruction execution system. For the purposes of this description, the computer readable medium 306 can be any apparatus that can tangibly store the program for use by or in connection with the instruction execution system, apparatus, or device, including the computer system 300.

The medium 306 can be any tangible electronic, magnetic, optical, electromagnetic, infrared, or semiconductor system (or apparatus or device). Examples of a computer readable medium 306 include a semiconductor or solid state memory, magnetic tape, a removable computer diskette, a random access memory (RAM), a read-only memory (ROM), a rigid magnetic disk and an optical disk. Some examples of optical disks include compact disk-read only memory (CD-ROM), compact disk-read/write (CD-R/W) and DVD.

The computing system 300, suitable for storing and/or executing program code, can include one or more processors 302 coupled directly or indirectly to memory 308 through a system bus 310. The memory 308 can include local memory employed during actual execution of the program code, bulk storage, and cache memories which provide temporary storage of at least some program code in order to reduce the number of times code is retrieved from bulk storage during execution. Input/output or I/O devices 304 (including but not limited to keyboards, displays, pointing devices, etc.) can be coupled to the system either directly or through intervening I/O controllers. Network adapters may also be coupled to the system to enable the computing system 300 to become coupled to other data processing systems, such as through host systems interfaces 312, or remote printers or storage devices through intervening private or public networks. Modems, cable modem and Ethernet cards are just a few of the currently available types of network adapters.

What is claimed is:

1. A system for optimizing an error rate of data through a communication channel, the system comprising:
   a data generator operable to generate a training sequence as a Markov code, and to propagate the training sequence through the communication channel;
   a Soft Output Viterbi Algorithm (SOVA) detector operable to estimate data values of the training sequence after propagation through the communication channel; and
   an optimizer operable to compare the estimated data values to the generated training sequence, to determine an error rate based on the comparison, and to change the training sequence based on the Markov code to lower the error rate of the data through the communication channel.

2. The system of claim 1, wherein:
   the channel is a storage media.

3. The system of claim 1, wherein:
   the channel is memoryless.

4. The system of claim 1, wherein:
   the channel is a channel with memory comprising intersymbol interference (ISI).

5. The system of claim 1, wherein:
   the optimizer is further operable to configure subsequent data through the channel based on the determined error rate.

6. The system of claim 5, further comprising:
   an encoder operable to configure the subsequent data with error correction coding.

7. The system of claim 6, wherein:
   the encoder is further operable to configure the error correction coding based on the determined error rate.

8. A method of optimizing an error rate of data through a communication channel, the method comprising:
   generating a training sequence as a Markov code;
   propagating the training sequence through the communication channel;
   estimating, with a Soft Output Viterbi Algorithm (SOVA) detector, data values of the training sequence after propagation through the communication channel;
   comparing the estimated data values to the generated training sequence;
   determining an error rate based on the comparison; and
   changing the training sequence based on the Markov code to lower the error rate of the data through the communication channel.

9. The method of claim 8, wherein:
   the channel is a storage media.

10. The method of claim 8, wherein:
    the channel is memoryless.

11. The system of claim 8, wherein:
    the channel is a channel with memory comprising intersymbol interference (ISI).

12. The method of claim 8, further comprising:
    configuring subsequent data through the channel based on the determined error rate.

13. The method of claim 12, further comprising:
    configuring the subsequent data with error correction coding.

14. The method of claim 13, further comprising:
    configuring the error correction coding based on the determined error rate.

15. A non-transitory computer readable medium comprising instructions that, when executed by a processor, are operable to direct the processor to optimize an error rate of data through a communication channel, the instructions further directing the processor to:
    generate a training sequence as a Markov code source;
    propagate the training sequence through the communication channel;
    estimate, with a Soft Output Viterbi Algorithm (SOVA) detector, data values of the training sequence after propagation through the communication channel;
    compare the estimated data values to the generated training sequence;
    determine an error rate based on the comparison; and
    change the training sequence based on the Markov code to lower the error rate of the data through the communication channel.

16. The computer readable medium of claim 15, wherein:
    the channel is a storage media.

17. The computer readable medium of claim 15, wherein:
    the channel is memoryless.

18. The computer readable medium of claim 15, wherein:
    the channel is a channel with memory comprising intersymbol interference (ISI).

19. The computer readable medium of claim 15, further comprising instructions that direct the processor to:
    configure subsequent data through the channel based on the determined error rate.

20. The computer readable medium of claim 19, further comprising instructions that direct the processor to:
   configure the subsequent data with error correction coding; and
   configure the error correction coding based on the determined error rate.

* * * * *